United States Patent [19]

Hegarty et al.

[11] 3,823,469

[45] July 16, 1974

[54] HIGH HEAT DISSIPATION SOLDER-REFLOW FLIP CHIP TRANSISTOR

[75] Inventors: Brian Anthony Hegarty; Lewis Herbert Trevail, both of Indianapolis, Ind.

[73] Assignee: RCA Corporation, New York, N.Y.

[22] Filed: Aug. 27, 1973

[21] Appl. No.: 391,665

Related U.S. Application Data

[62] Division of Ser. No. 138,244, April 28, 1971, Pat. No. 3,772,575.

[52] U.S. Cl. .................................... 29/589, 29/626

[51] Int. Cl. .............................................. B01j 17/00

[58] Field of Search ............. 29/589, 590, 577, 626, 29/628

[56] References Cited

UNITED STATES PATENTS

| | | | |
|---|---|---|---|
| 3,392,442 | 7/1968 | Napier | 29/589 |
| 3,517,279 | 6/1970 | Ikeda | 317/234 |
| 3,539,882 | 11/1970 | Mulford | 317/234 |
| 3,657,610 | 4/1972 | Yamamoto | 317/234 |
| 3,659,156 | 4/1972 | Baneking | 29/589 |
| 3,697,828 | 10/1972 | Oakes | 317/234 |

*Primary Examiner*—W. Tupman
*Attorney, Agent, or Firm*—William S. Hill; Glenn H. Bruestle

[57] ABSTRACT

An improved method of flip-chip mounting a semiconductor device, such as a transistor, on a pattern of electrical conductors carried on an insulating substrate, comprising providing the device chip with a glass protective layer and on the glass layer metallized bonding pads adjacent to the corners of the chip. Each of the bonding pads includes a relatively wide portion adapted to contain a relatively high mound of solder, and a second portion of a relatively narrow width capable of holding only a thin layer of solder. The thin solder layers overlie heat-generating P-N junction portions of the device. The conductors on the substrate have solder-wettable portions of larger areas than the bonding pads on the chip. Solder balls are placed on the wide portions of the bonding pads and melted to reflow the solder. The chip is then placed face down over the conductors on the substrate and the solder is again reflowed so that the relatively high mounds collapse to the thickness of the thin solder layer portions and the relatively thin solder layer portions are joined directly to the substrate conductors.

1 Claim, 15 Drawing Figures

HIGH HEAT DISSIPATION SOLDER-REFLOW FLIP CHIP TRANSISTOR

This is a division of application Ser. NO. 138,244, filed Apr. 28, 1971, now U.S. Pat. No. 3,772,575.

BACKGROUND

In manufacturing so-called hybrid integrated circuits, semiconductor devices and other discrete components must be mounted on terminal portions of conductor leads printed on an insulating substrate. The accurate and economical mounting of devices such as transistors has been a problem. Early forms of these hybrid circuits utilized wires to connect the device electrodes to the proper terminal leads on the substrate. But this type of bonding requires painstaking, individual work by a trained operator, and greatly adds to the expense of the product.

Later, several hybrid circuit device bonding methods were devised to eliminate the wire bonding and enable a semiconductor device chip to be bonded directly to the terminal leads on the substrate using a brazing or soldering operation. One of these is the so-called "flip-chip" method which involves providing raised solder bumps electrically connected to the device electrodes and corresponding solder-wettable terminals on the substrate conductor pattern. A machine or operator positions the device chip with the solder bumps positioned accurately on solder-wettable terminal portions and then heat is applied to melt the solder and permanently join the device to the substrate.

It has been found by experiment that, from a mechanical mounting standpoint, the best location for the solder bumps is at the corners of the device chip since this provides the most tolerance in positioning the device with respect to the substrate terminals.

Devices such as transistors, however, usually have their emitter regions, and consequently their emitter-base junctions, in the central area of the chip. In a transistor, the most heat is generated in the collector-base junction under the emitter areas and it is desirable to provide a good thermal path to conduct heat rapidly away from that part of the device when it is in operation. With the only short and direct metallic contact between the device chip and the substrate conductors being at the corners of the chip, a highly unsatisfactory thermal path results for the heat generated beneath the emitter region (or regions). It is not practical to increase the areas of the solder bumps to take in the central portion of the chip as well as the corners, using the kind of circular solder bonding pads previously known.

OBJECTS OF THE INVENTION

One object of the present invention is to provide an improved semiconductor device chip intended to be flip-chip bonded to a pattern of substrate conductors in a hybrid circuit.

Another object of the invention is to improve the heat dissipation qualities of flip-chip mounted semiconductor devices.

Another object of the invention is to provide an improved method of flip-chip mounting semiconductor devices on a pattern of circuit conductors such that heat conduction from centrally located P-N junctions to the substrate will be improved.

DESCRIPTION OF PREFERRED EMBODIMENTS

The Drawing

A preferred embodiment of a device in accordance with the invention, and a method of manufacture in accordance with the invention, will now be described. The method will be explained in connection with making a bipolar transistor having a plurality of isolated emitter regions diffused into a base region. But it could apply just as well to a single large emitter region. The transistor is to be mounted on solder-wettable conductor terminals which have been screen-printed on a ceramic substrate.

Figures 1, 2, 3, 4, 5, 6:
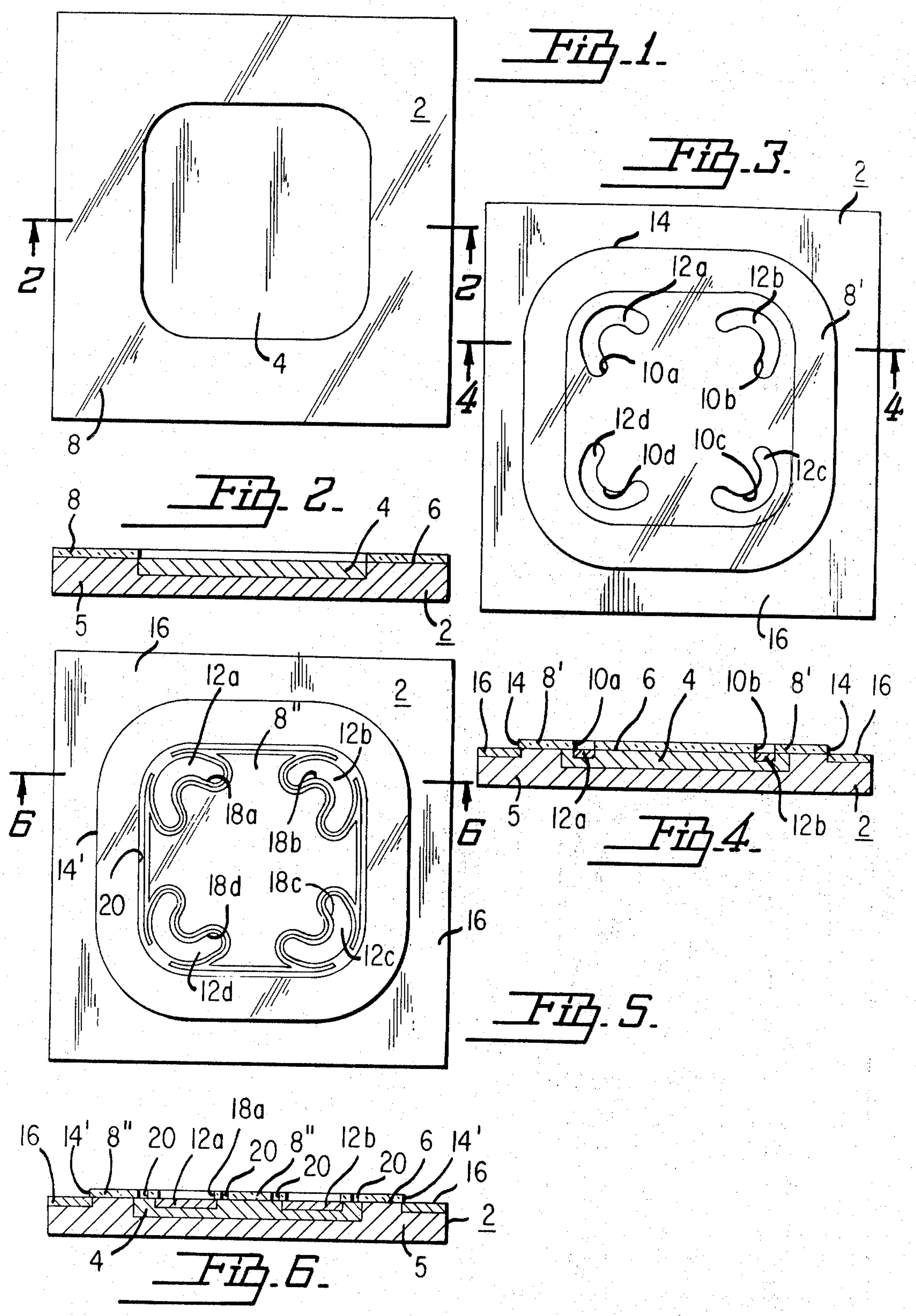
FIG. 1 is a plan view of a transistor device chip in an early stage of making a device in accordance with the present invention.
FIG. 2 is a cross-section view taken along the line 2—2 of FIG. 1.
FIG. 3 is a plan view of the transistor of FIGS. 1 and 2 at the stage where the emitter regions have been diffused into the base region.
FIG. 4 is a cross-section view taken along the line 4—4 of FIG. 3.
FIG. 5 is a plan view of the device of the preceding FIGURES showing the device covered with a diffusion mask having openings therein for the deposition of metallic electrode contacts.
FIG. 6 is a cross-section view taken along the line 6—6 of FIG. 5.

As illustrated in FIGS. 1 and 2, the semiconductor device includes a silicon wafer or chip 2 of N-type conductivity, having a centrally located base region 4 diffused therein. It will be understood that this wafer is actually a part of a much larger slice at this stage of manufacture and that several hundred such device chips or wafers will be processed simultaneously. The top surface 6 of the wafer has a silicon dioxide passivating coating 8 covering it except where the base region 4 is formed by diffusing P-type impurities into the N-type wafer.

The transistor also has an N-type collector region 5.

The next step of the process is to diffuse a plurality of emitter regions into the base region. This is done by first regrowing or redepositing a silicon dioxide passivating coating 8' (FIG. 4) over the entire surface 6 of the wafer and then, by conventional photomasking and etching techniques, opening apertures in the silicon dioxide coating 8' to diffuse impurities into the wafer. As shown in FIGS. 3 and 4, the silicon dioxide coating 8' has openings 10*a*, 10*b*, 10*c* and 10*d* into which N-type impurities are diffused to form isolated emitter regions 12*a*, 12*b*, 12*c* and 12*d*. In this device, the emitter regions take the shape roughly, of crescents, although other geometrical designs may be used. Around the periphery of the wafer 2, an annular opening 14 is provided in the silicon dioxide coating 8' and a ring of N-type impurities 16 is diffused through this opening into the collector region 5, to form an N+ collector region contact.

Th next step is to regrow the silicon dioxide passivating layer once more, forming a coating 8'' and then providing openings therein so that emitter, base and collector contact metallizations may be deposited. As shown in FIGS. 5 and 6, emitter contact openings 18*a*, *b*, *c*, *d*, correspond to emitter regions 12*a*, *b*, *c* and *d*. The base contact opening 20 comprises a slot which exposes a narrow portion of the base region near its periphery and also follows the contours of the four isolated emitter regions 12*a*–12*d*. There is also a collector contact opening 14' which exposes part of the N+ collector contact 16.

Figures 7, 8, 10, 11:
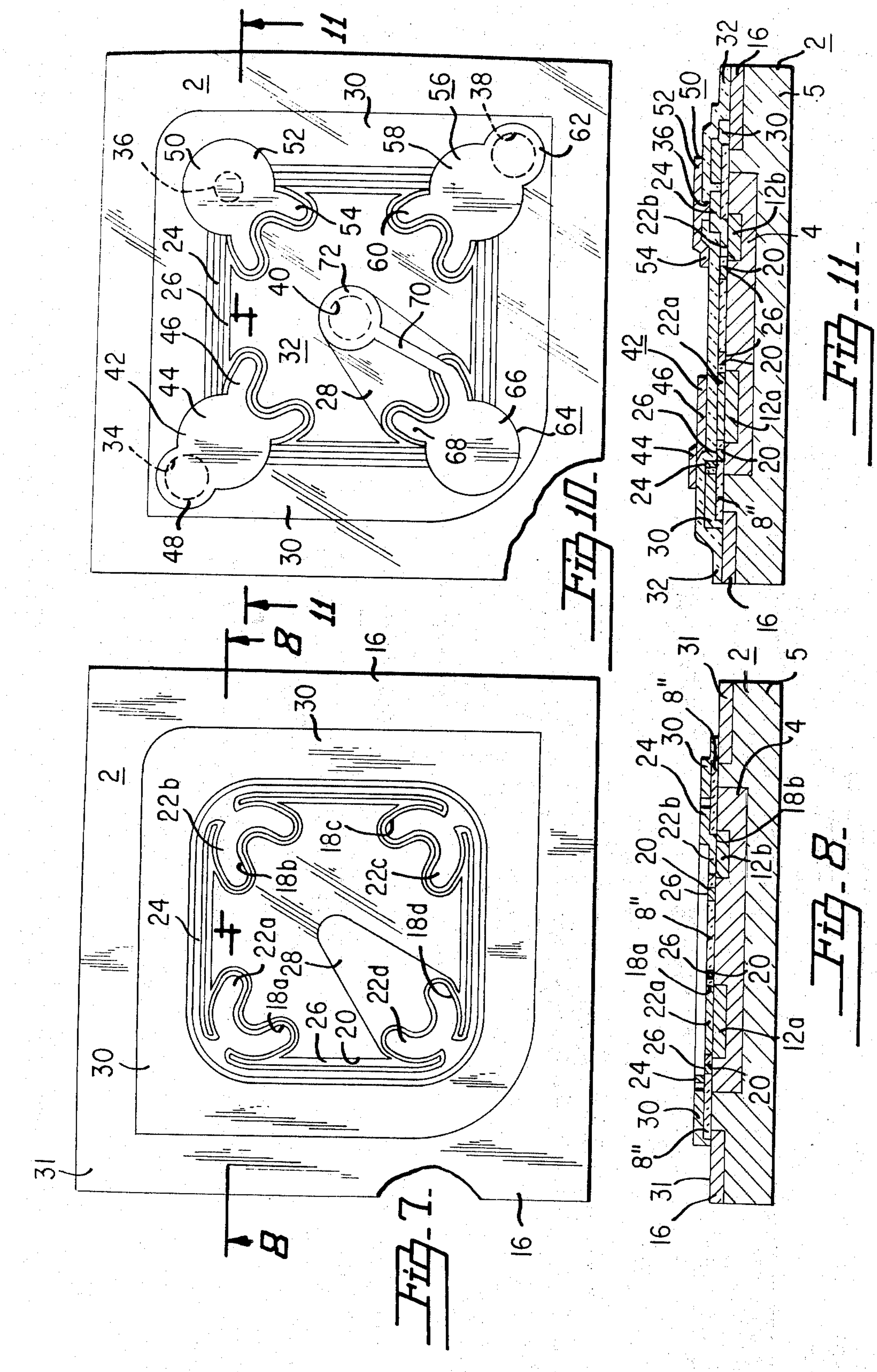
FIG. 7 is a plan view like that of FIG. 5 with metallic electrode contacts deposited.
FIG. 8 is a cross-section view taken along the line 8—8 of FIG. 7.
FIG. 10 is a plan view like that of the previous FIGURES showing bonding pads in place.
FIG. 11 is a cross-section view taken along the line 11—11 of FIG. 10.

The next step is to deposit emitter, base and collector contact metallization through the openings which have been described above. This is done by evaporating a layer of aluminum over the entire top surface of the wafer and then, by masking and etching techniques, removing all of the metal except the parts needed to make contacts and connections. Referring now to FIGS. 7 and 8, aluminum layers 22*a*–22*d* contact the emitter regions 12*a*–12*d*, respectively. In order to connect together all of the isolated emitter regions, a connecting band of aluminum 24 is disposed on top of the silicon dioxide layer 8'' and this connecting band 24 has neck portions connected to the emitter contact layers 22*a*–22*d*. Connected to the base region metal connection 26, within the slot 20, is a metallic arm 28 which extends over the top of the silicon dioxide coating 8'' to the center of the chip. A ring of metal (vapor deposited aluminum) 30 surrounds the emitter connecting contact band 24 and makes contact with the N+ collector contact region 16. Part of the collector contact metal layer 30 rests on top of the silicon dioxide layer 8''. An open area 31 is left around the periphery of the device so that the individual device chips may later be separated from each slice on which hundreds of indivisual devices are made simultaneously.

Figure 9:
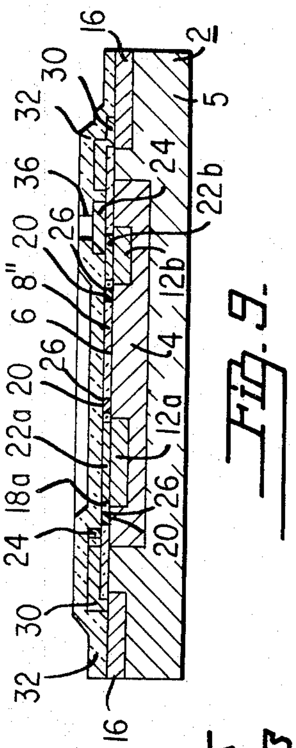
FIG. 9 is a cross-section view like that of FIG. 8 with a glass protective layer covering the device.

As shown in FIG. 9, a thin layer of glass 32 is next deposited over the entire surface of the wafer. The glass may be a borosilicate type deposited by passing a mixture of diborane and silane, diluted with argon, over the heated surface of the device chip. The glass layer 32 may be about 2.0 to 7 microns thick. The glass provides good protection against moisture using relatively thin layers. Other types of glass may be used such as lead glass.

In order to make electrical contact to the emitter, base and collector regions of the device, openings are etched through the glass layer using an etching solution which may comprise hydrofluoric acid (48% HF), 300 ml. per liter and sodium lauryl sulfate, (a wetting agent) 5 drops per liter. To this etching solution is added a soluble compound of a metal which will deposit on the aluminum surface of the metal contacts rapidly enough to prevent aluminum oxide from forming. This metal can be zinc sulfate in the form of $ZnSO_4 \cdot 6H_2O$ at a concentration of 170 grams per liter. If a thin layer of aluminum oxide is permitted to form on the aluminum contact metal during the etching process, it is difficult to make a good metallic low resistance connection to the emitter, base and collector metal contacts. It is desirable to have a sufficiently concentrated hydrofluoric acid etching solution to etch the glass at a rate of about 100 A to 200 A per second and to include a soluble compound of a metal having an electrode potential below that of aluminum in the electrochemical series. The concentration of the metal compound must be high enough to cause metal to be deposited faster than it is being dissolved.

By this etching method, (FIG. 10) openings 34 and 38 are etched through the glass layer 32 adjacent opposite corners of the chip, to form collector contact openings to the metal band 30, and opening 36 is etched through the layer 32 near an intermediate corner of the chip to form an emitter contact opening to emitter connecting band 24. An opening 40 etched through the glass layer 32 at the center of the chip, provides an opening to base contact 28.

The next step is to deposit emitter, base and collector contact pads on the surface of the glass layer 32 with some of the metal being deposited in the etched openings to make contact to the emitter, base and collector regions. As shown in FIG. 10, these metal contact pads have a particular shape which is important to the principles of the present invention. First a layer of aluminum is evaporated over the entire surface of the glass and then by conventional photomasking and etching techniques all of the aluminum is removed except those portions required for the contact pads. Oe of these pads 42 has a portion 44 of relatively wide dimensions to accommodate a solder mound which will be relatively high. The contact pad 42 also has another portion 46 of relatively narrow dimensions overlying the emitter region 12*a*. This portion will accommodate only a thin solder layer. The contact pad 42 also has another circular portion 48 which is merely an extension to include the etched opening 34 through which contact is made to the collector contact metal band 30. The contact pad 42 is disposed in one corner of the device chip.

In an opposite corner of the device chip is a similar contact pad 56 having a portion of relatively wide dimensions 58, a portion of relatively narrow dimensions 60 overlying emitter region 12*c*, and a circular extension 62 which includes the etched opening 38, also making contact to the collector contact band 30.

In another corner of the chip is a third contact pad 50 having a portion of relatively wide dimension 52 and a portion of relatively narrow dimension 54 overlying the emitter region 12*b*. This pad makes contact to the emitter connecting metallization through the opening 36 in glass layer 32.

A fourth contact pad 64 is disposed in the corner of the chip opposite the emitter contact pad 60. The contact pad 64 has one portion of relatively wide dimension 66 adjacent the corner of the chip and another portion of relatively narrow dimension 68 which covers the emitter area 12*d*. The portion 68 is also connected to a ribbon on metal 70 having an enlarged end portion 72 which overlies the opening 40 in the glass layer 32. Metal extends through the opening 40 making contact with the base metallization arm 28 on the metallized layer beneath the glass.

Figure 12:
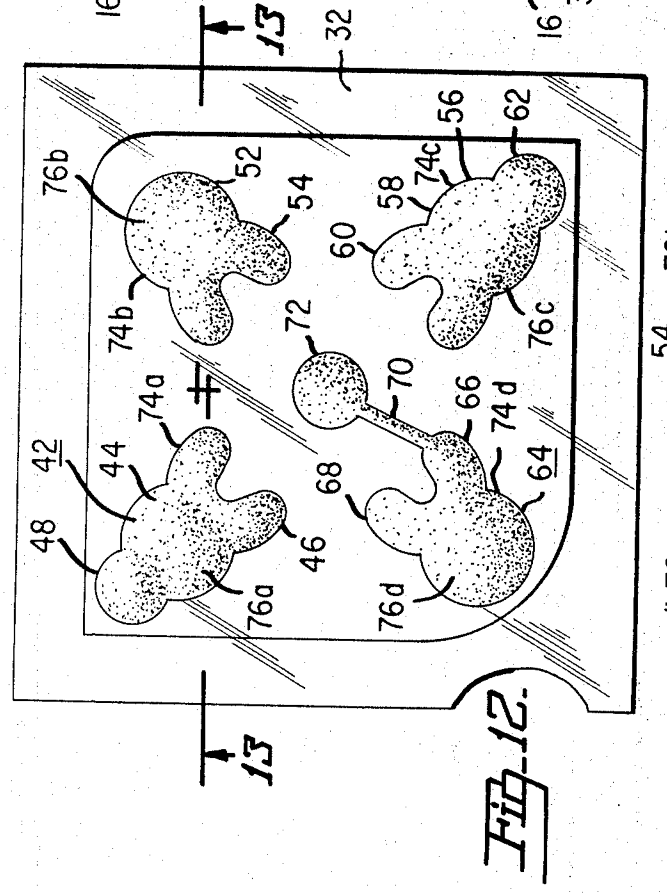
FIG. 12 is a plan view like that of FIG. 11 showing only the bonding pads with solder deposited thereon.

Each of the metal contact pads 42, 50, 56 and 64 is coated with another metal which makes it solder-wettable. This can be done conventionally as by first depositing a thin layer of zinc by chemical displacement and then a thin layer of nickel by electroless deposition the composite layer being designated (FIGS. 12 and 13) 74*a, b, c* and *d* in the respective contact pads 42, 50, 56 and 64.

Figure 13:
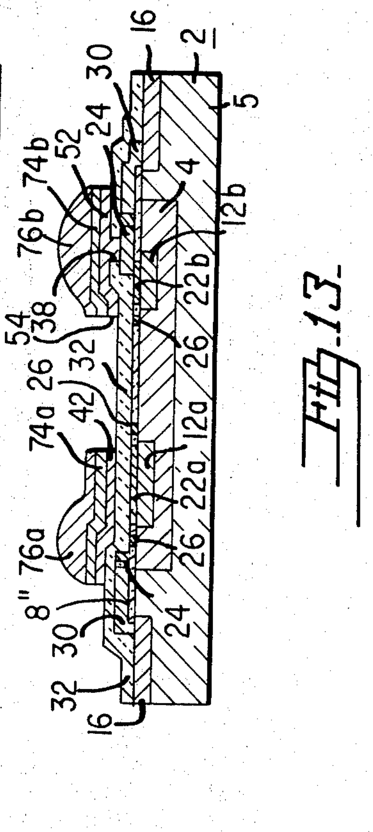
FIG. 13 is a section view taken along the line 13—13 of FIG. 12.

The metal contact pads are next given a coating of solder. This may be done by dipping the entire chip in a molten solder bath. A thin layer of solder adheres to all of the nickel coated areas but does not adhere to the glass surface. Solder balls are then placed, one on each of the areas 44, 52, 58 and 66 and the solder is melted and permitted to flow around the metallized areas. This operation forms solder layers 76*a, b, c* and *d* on the metallized pads 42, 50, 56 and 64 respectively. As shown in FIG. 13, relatively high solder bumps form on the portions 44, 52, 58 and 66 of the metal contact pads. But, because of their narrower dimensions, the solder layer remains relatively thin on the portions 46, 54, 60 and 68 overlying the emitter areas. The solder also remains relatively thin on the areas 48, 62, 70 and 72 of the metal contact pads.

Figure 14:
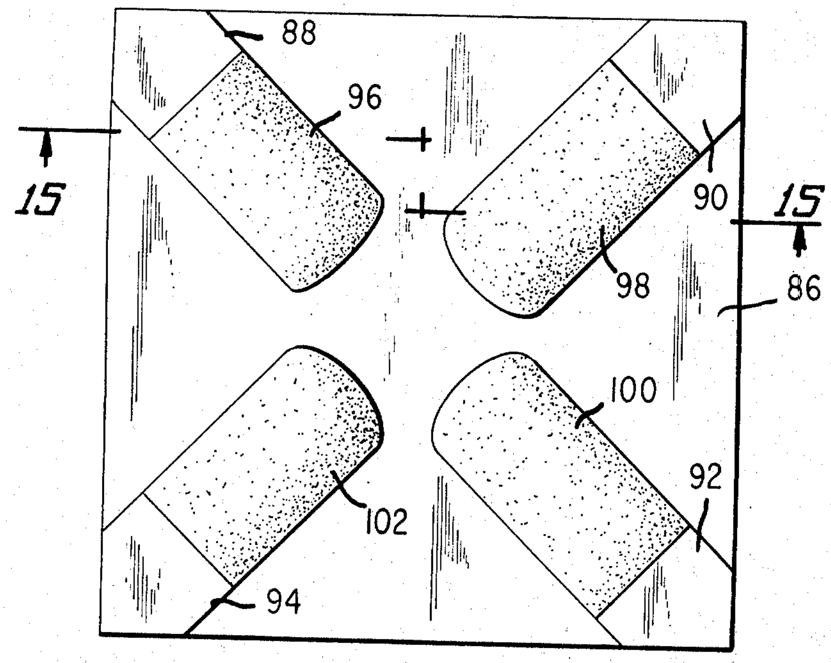
FIG. 14 is a plan view of a pattern of conductor terminals adapted to receive the device of the preceding FIGURES.

The metal slice is now divided into separate chips and each chip is ready to be mounted on the appropriate terminal ends of the conductors on the circuit substrate. A small portion of a printed circuit substrate is illustrated in FIG. 14. This comprises a ceramic substrate 86 having conductors 88, 90, 92 and 94 deposited thereon. These conductors may comprise flat ribbons of a cermet conductor composition deposited by screen printing. The end portions of these conductors may be coated with a thin layer of nickel 96, 98, 100 and 102, respectively, to make them solder-wettable.

Figure 15:
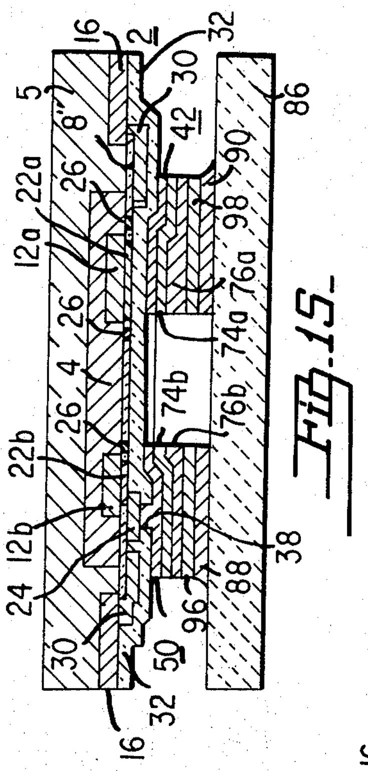
FIG. 15 is a section view of the mounted device.

To mount the chip on the circuit, it is placed face down so that each of the contact pads 42, 50, 56 and 64 contacts one of the metallized end portions 98, 96, 102 and 100, respectively (FIG. 15). The assembly is then raised to a temperature sufficiently high to melt the solder. Since the conductor ends have solder-wettable areas which are somewhat larger than the soldered areas of the metal contact pads, when the solder melts, the large bumps of solder collapse and flow over the metallized areas of the substrate conductors and this result in having a uniform thin layer of solder between the metallized contact pads on the chip and the metallized terminal ends on the substrate. Solder is a relatively poor conductor of heat and since the solder layer between the two parts is thin, a good thermal path exists between the emitter areas and the substrate. This provides much improved heat conduction properties from emitter-to-substrate compared to previously known types of flip-chip connections. There is no need to conduct heat away rapidly from metallized areas 70 and 72 so no provision is made for the solder on these areas to contact solder-wettable areas on the substrate conductors.

We claim:

1. A flip-chip method of connecting a semiconductor device chip having electrode regions and a heat-generating portion, to a pattern of electrical conductors on an insulating substrate, comprising:

providing said device with a thin glass insulating layer covering the surface of said device which is to face said conductors, said layer having openings therein leading to said electrode regions, providing solder-wettable bonding pads on said glass layer electrically connected to said electrode regions through said openings, said bonding pads having portions of relatively wide dimension disposed adjacent corners of said chip and other portions of relatively narrow dimensions disposed over said heat-generating portion, applying solder to said bonding pads such that relatively high mounds of solder are held on said relatively wide dimension portions and thin layers of solder are held on said narrow dimension portions, providing said conductor pattern with solder-wettable areas larger than the solder-containing areas on said chip, placing said chip face down on said substrate such that said relatively high solder mounds of said chip are in contact with the solder-wettable areas of said conductors, and heating to reflow said solder such that said relatively high mounds of solder collapse and said thin layers of solder come into good electrical and heat conducting contact with said solder-wettable areas on said conductors.

* * * * *